(12) United States Patent
Wang et al.

(10) Patent No.: US 11,043,239 B2
(45) Date of Patent: Jun. 22, 2021

(54) MAGNETO-OPTIC KERR EFFECT METROLOGY SYSTEMS

(71) Applicant: KLA Corporation, Milpitas, CA (US)

(72) Inventors: Jun Wang, Shanghai (CN); Yaolei Zheng, Shanghai (CN); Chunxia Li, Shanghai (CN); Changfei Yan, Shanghai (CN); Lansheng Dong, Shanghai (CN); Yang Zhou, Shanghai (CN); Hai-Yang You, Shanghai (CN); Haijing Peng, Shanghai (CN); Jianou Shi, Palo Alto, CA (US); Rui Ni, Shanghai (CN); Shankar Krishnan, Santa Clara, CA (US); David Y. Wang, Santa Clara, CA (US); Walter H. Johnson, Rocklin, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/821,192

(22) Filed: Mar. 17, 2020

(65) Prior Publication Data
US 2020/0302965 A1    Sep. 24, 2020

Related U.S. Application Data

(60) Provisional application No. 62/821,098, filed on Mar. 20, 2019, provisional application No. 62/830,372, (Continued)

(51) Int. Cl.
*G11B 11/105* (2006.01)

(52) U.S. Cl.
CPC ..... *G11B 11/10506* (2013.01); *G11B 11/1051* (2013.01); *G11B 11/10521* (2013.01)

(58) Field of Classification Search
None
See application file for complete search history.

(56) References Cited

U.S. PATENT DOCUMENTS

| 5,156,943 A | * | 10/1992 | Whitney | .............. | G02B 5/1876 |
| | | | | | 430/22 |
| 5,291,340 A | | 3/1994 | Kashima | | |

(Continued)

FOREIGN PATENT DOCUMENTS

| CN | 203658673 U | 6/2014 |
| CN | 106168711 A | 11/2016 |

(Continued)

OTHER PUBLICATIONS

WIPO, ISR for PCT/US2020/024062, dated Jul. 9, 2020.
(Continued)

*Primary Examiner* — Tan X Dinh
(74) *Attorney, Agent, or Firm* — Hodgson Russ LLP

(57) ABSTRACT

A laser beam is directed through a transmissive axicon telescope or a reflective axicon telescope such as in a magneto-optic Kerr effect metrology system. With the transmissive axicon telescope, a Gaussian beam profile is directed through a first axicon lens and a second axicon lens. The first axicon lens and second axicon lens transfer the Gaussian beam profile of the laser beam to a hollowed laser ring. The laser beam with a hollowed laser ring can be directed through a Schwarzschild reflective objective. With the reflective axicon telescope, the laser beam is directed through two conical mirrors that are fully reflective. One of the conical mirrors defines a central hole that the laser beam passes through.

10 Claims, 11 Drawing Sheets

Related U.S. Application Data filed on Apr. 6, 2019, provisional application No. 62/836,821, filed on Apr. 22, 2019.

(56) References Cited

U.S. PATENT DOCUMENTS

| | | | |
|---|---|---|---|
| 5,608,526 A | 3/1997 | Piwonka-Corle et al. | |
| 5,609,780 A * | 3/1997 | Freedenberg | G01J 1/4257 219/121.73 |
| 5,859,424 A | 1/1999 | Norton et al. | |
| 6,429,943 B1 | 8/2002 | Opsal et al. | |
| 6,894,823 B2 | 5/2005 | Taylor et al. | |
| 7,006,221 B2 | 2/2006 | Wolf et al. | |
| 7,085,075 B2 | 8/2006 | Mann et al. | |
| 7,190,460 B2 | 3/2007 | Wang | |
| 7,292,341 B2 | 11/2007 | Brill et al. | |
| 7,478,019 B2 | 1/2009 | Zangooie et al. | |
| 7,684,145 B2 | 3/2010 | Drent et al. | |
| 7,933,026 B2 | 4/2011 | Opsal et al. | |
| 8,238,042 B2 | 8/2012 | Dewitt et al. | |
| 8,743,165 B2 * | 6/2014 | Sandstrom | B23K 26/0676 347/225 |
| 9,110,316 B2 | 8/2015 | Eliseev et al. | |
| 9,115,987 B2 | 8/2015 | Liu et al. | |
| 9,291,554 B2 | 3/2016 | Kuznetsov et al. | |
| 9,581,430 B2 | 2/2017 | Manassen et al. | |
| 9,605,947 B2 | 3/2017 | Kreuzer et al. | |
| 9,739,702 B2 | 8/2017 | Bringoltz et al. | |
| 9,915,522 B1 | 3/2018 | Jiang et al. | |
| 10,309,907 B2 | 6/2019 | Zhang et al. | |
| 10,769,320 B2 | 9/2020 | Kuznetsov et al. | |
| 2003/0210393 A1 | 11/2003 | Vaez-Iravani et al. | |
| 2007/0153273 A1 * | 7/2007 | Meeks | G01N 21/95607 356/369 |
| 2009/0059236 A1 * | 3/2009 | Meeks | G01B 11/065 356/445 |
| 2009/0266802 A1 * | 10/2009 | Sawabe | B23K 26/082 219/121.67 |
| 2010/0044359 A1 * | 2/2010 | Sawabe | B23K 26/03 219/121.83 |
| 2013/0003050 A1 * | 1/2013 | Zhu | G01N 21/8422 356/73 |
| 2014/0118819 A1 | 5/2014 | Sanson | |
| 2014/0152991 A1 * | 6/2014 | Heo | G01B 11/24 356/445 |
| 2014/0172394 A1 | 6/2014 | Kuznetsov et al. | |
| 2014/0222380 A1 | 8/2014 | Kuznetsov et al. | |
| 2014/0253892 A1 | 9/2014 | Yu et al. | |
| 2015/0204664 A1 | 7/2015 | Bringoltz et al. | |
| 2015/0293457 A1 | 10/2015 | Epple et al. | |
| 2018/0003630 A1 | 1/2018 | Grunzweig et al. | |
| 2018/0354068 A1 * | 12/2018 | Duan | B23K 26/0648 |
| 2020/0273662 A1 * | 8/2020 | Zhang | G02B 27/0972 |

FOREIGN PATENT DOCUMENTS

| | | |
|---|---|---|
| JP | 2002365232 A | 12/2002 |
| JP | 2003022959 A | 1/2003 |
| JP | 2014235365 A | 12/2014 |
| KR | 20140014509 A | 2/2014 |
| KR | 20170019855 A | 2/2017 |
| WO | 2017186681 A1 | 11/2017 |

OTHER PUBLICATIONS

Rana, Bivas, Quasistatic and Ultrafast Magnetization Dynamics in Magnetic Nanostructures, Thesis submitted at Univ. of Calcutta, 2013, Chapter 4, pp. 75-108.

Hiamrle, Jaroslav, Magneto-Optical Determination of the In-Depth Magnetization Profile in Magnetic Multilayers, Thesis submitted at Univ. Paris, 2003.

Niadorff & Dewitt, Reflaxicon Objectives for Imaging, Proc. of SPIE, Oct. 2012, pp. 1-16.

Wang et al., Design Method of Aspheric Schwarzschild Objective with a Low Obscuration and an Infinite Conjugation Distance, Optics Communications, Dec. 2019, 460, 125055.

* cited by examiner

MAGNETO-OPTIC KERR EFFECT METROLOGY SYSTEMS

CROSS-REFERENCE TO RELATED APPLICATIONS

This application claims priority to the provisional patent application filed Mar. 20, 2019 and assigned U.S. App. No. 62/821,098, the provisional patent application filed Apr. 6, 2019 and assigned U.S. App. No. 62/830,372, and the provisional patent application filed Apr. 22, 2019 and assigned U.S. App. No. 62/836,821, the disclosures of which are hereby incorporated by reference.

FIELD OF THE DISCLOSURE

This disclosure relates to metrology systems for semiconductor wafers.

BACKGROUND OF THE DISCLOSURE

Evolution of the semiconductor manufacturing industry is placing greater demands on yield management and, in particular, on metrology and inspection systems. Semiconductor device critical dimensions (CD) continue to shrink, profiles become more complex, and vertical dimensions continue to increase, yet the industry needs to decrease time for achieving high-yield, high-value production. Improved measurement sensitivity is needed. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various vertical features and multiple levels of the device structures. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Metrology may be used during semiconductor manufacturing to take various measurements of, for example, a semiconductor wafer or reticle during various process steps to form devices. Metrology tools can be used to measure structural and material characteristics associated with various semiconductor fabrication processes. For example, the metrology tools can measure material composition or can measure dimensional characteristics of structures and films such as film thickness, critical dimension of structures, profiles, or overlay. These measurements are used to facilitate process controls and/or yield efficiencies during the manufacture of semiconductor dies.

As semiconductor device pattern dimensions continue to shrink, smaller metrology targets are often required. Furthermore, the requirements for measurement accuracy and matching to actual device characteristics increase a need for device-like targets as well as in-die and even on-device measurements. For example, focused beam ellipsometry based on primarily reflective optics may be used. Apodizers can be used to mitigate the effects of optical diffraction causing the spread of the illumination spot beyond the size defined by geometric optics. The use of high-numerical-aperture tools with simultaneous multiple angle-of-incidence illumination is another way to achieve small-target capability.

In optical metrology system, multiple or variable incident angle capability is gaining importance when obtaining wafer surface information such as optical properties, electrical properties, and magneto-optical properties. Different incident laser beams usually reflect a variety of sample information from different points of view. With the development of nanotechnology, there is a demand for a high spatial resolution laser spot in semiconductor metrology systems for patterned structures. In the last few decades, researchers and engineers combined the variable incident angle with high spatial resolution and many kinds of design and experimental apparatus were tested for semiconductor logic and memory chips.

With surface magneto-optic Kerr effect (SMOKE), the signal collected from different incident angles may have some differences. Therefore, a metrology system with multiple incident angles may be needed for surface information detection like polarization, reflectivity, and nanostructure. Using the variable incident angle system also can find the best signal-to-noise ratio to optimize the system performance. Furthermore, results can be typically fitted and determined at a certain incident angle, but usually measurements were made at more than two angles of incidence to reduce the effects of random errors. Exact fit to the data is typically impossible and some criterion may be needed to define, especially for measurements on thin (<10 nm) films where sensitivity is low.

Most laser scanners use moveable mirrors to steer the laser beam, but this method may be unable to achieve accurate laser position and repeatability because of the mechanical tolerance. Using an electro-optic deflector (EOD) is a faster way to achieve the goal. Using EOD together with a commercial objective lens to deterministically and quickly position the focus spot, the EODs can be viewed as tunable diffraction gratings. Thus, the output angle of lightwave propagated through the electro-optic medium will be tunable as well. However, this technique has the disadvantage of low efficiency. More than half of the laser power cannot be used in the output due to the diffractive efficiency.

In a previous technique, an optical system focuses the beam of light into a spot on a sample. The optical system has a numerical aperture (NA) ranging from 0.2 to 0.9. An optical axis of the beam of light was obliquely incident on the sample. A channel selector was configured to receive the beam of light after interacting with the sample. Multiple channels having at least one of different angles of incidence and different azimuth angles were simultaneously selected. The laser power loss using this technique was large. Only part of the incident laser power could be selected and used for the detection signal.

In another previous technique, a lens was used to focus the incoming light to provide the range of different angles of incidence. The range of angles was at least one or two degrees and preferably thirty degrees or more. A second lens refocuses the interacted light to a linear, multi-element detector array which extends in the plane of incidence. Each of the detector elements detected a narrow range of angles of incidence within the relatively wider range of angles of incidence of the illuminating beam. The acquisition speed was limited by the detector arrays and this technique could not be used with a sampling rate larger than 10 kHz.

In yet another previous technique, an incident light beam was produced and propagated in a certain direction towards the sample through an illumination channel. This technique had unacceptable laser/light power loss.

Therefore, new metrology systems and metrology methods are needed.

BRIEF SUMMARY OF THE DISCLOSURE

A system is provided in a first embodiment. The system comprises a laser source that generates a laser beam with a Gaussian beam profile; an transmissive axicon telescope or a reflective axicon telescope configured to transform the Gaussian beam profile of the laser beam to a hollowed laser ring; an optical component configured to receive the laser beam with the hollowed laser ring; a stage configured to hold a wafer; a detector configured to receive the laser beam reflected from the wafer; and a focal lens disposed between the detector and the optical component. The optical component is a beam splitter or a fold mirror.

The transmissive axicon telescope includes a first axicon lens; a second axicon lens; and an objective disposed between the optical component and the stage, wherein the objective is a Schwarzschild reflective objective. The laser beam passes through the first axicon lens and the second axicon lens.

The laser beam can have an incident angle from 16 degrees to 30 degrees using the Schwarzschild reflective objective.

The Schwarzschild reflective objective can be fully reflective.

The first axicon lens and the second axicon lens can be configured to include a same angle.

The reflective axicon telescope includes two conical mirrors that are fully reflective. One of the conical mirrors defines a central hole that the laser beam passes through.

An electromagnet can be disposed proximate the stage.

A spot size of the laser beam directed through the objective and onto the wafer can be less than 1 µm.

A magneto-optic Kerr effect metrology system can include the system of the first embodiment.

A method is provided in a second embodiment. The method comprises directing a laser beam through an transmissive axicon telescope or a reflective axicon telescope thereby transforming the Gaussian beam profile of the laser beam to a hollowed laser ring. The laser beam with the hollowed laser ring is directed at an optical component. The optical component may be a beam splitter or a fold mirror. The laser beam with the hollowed laser ring is directed toward a wafer; reflected off the wafer to a focal lens; and received from the focal lens at a detector.

Directing through the transmissive axicon telescope includes: directing a laser beam with a Gaussian beam profile through a first axicon lens and a second axicon lens and directing the laser beam with the hollowed laser ring through an objective toward the wafer. The objective is a Schwarzschild reflective objective.

A gap between the first axicon lens and the second axicon lens can be adjusted whereby a diameter of the laser beam with the hollowed laser ring is adjusted while collimation is constant.

An incident angle of the laser beam with the hollowed laser ring can be adjusted while the collimation is constant.

A magneto-optic Kerr effect metrology signal can be determined at an angle using a processor in electronic communication with the detector.

Directing through the reflective axicon telescope includes directing a laser beam through two conical mirrors that are fully reflective. One of the conical mirrors defines a central hole that the laser beam passes through.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Optical systems that provide variable incident angle with high spatial resolution in a magneto-optic Kerr effect (MOKE) metrology system are disclosed. The embodiments disclosed herein can continuously change the laser incident angle in a large scale and focus the laser beam into a small size, which can provide an easier and broader way to detect the MOKE signal of a patterned wafer. For example, the embodiments disclosed herein can be used to detect a MOKE signal of memory chips, such as on the pattern wafers that contains MRAM memory chips or dies. Two axicon lenses are combined and the gap between the apex of the two lenses can be changed. An outputted laser hollowed ring with variable diameter illuminates the pupil of the objective lens, which can provide variable incident angle. By using the embodiments disclosed herein in MOKE metrology apparatus, the signal with different laser incident angles to the patterned wafer surface can be obtained and investigated in the MOKE metrology system.

The hollowed laser ring can be combined with objectives to avoid an obscured area of the second mirror in the objective and to improve the objective transmittance. This can overcome the problem of low laser reflectivity. A traditional Gaussian beam has large power loss in a Schwarzschild reflective objective because most of the laser power is distributed around the beam center, but the center area typically cannot be reflected by the second mirror in classic reflective objective, which is called pupil obscuration. In some instance, approximately 30% of the laser area around the center point is not reflected by the second mirror inside the Schwarzschild reflective objective, which can lead to a loss of more than 50% laser power. This limits laser application implementation in Schwarzschild reflective objective structures.

Figure 1:
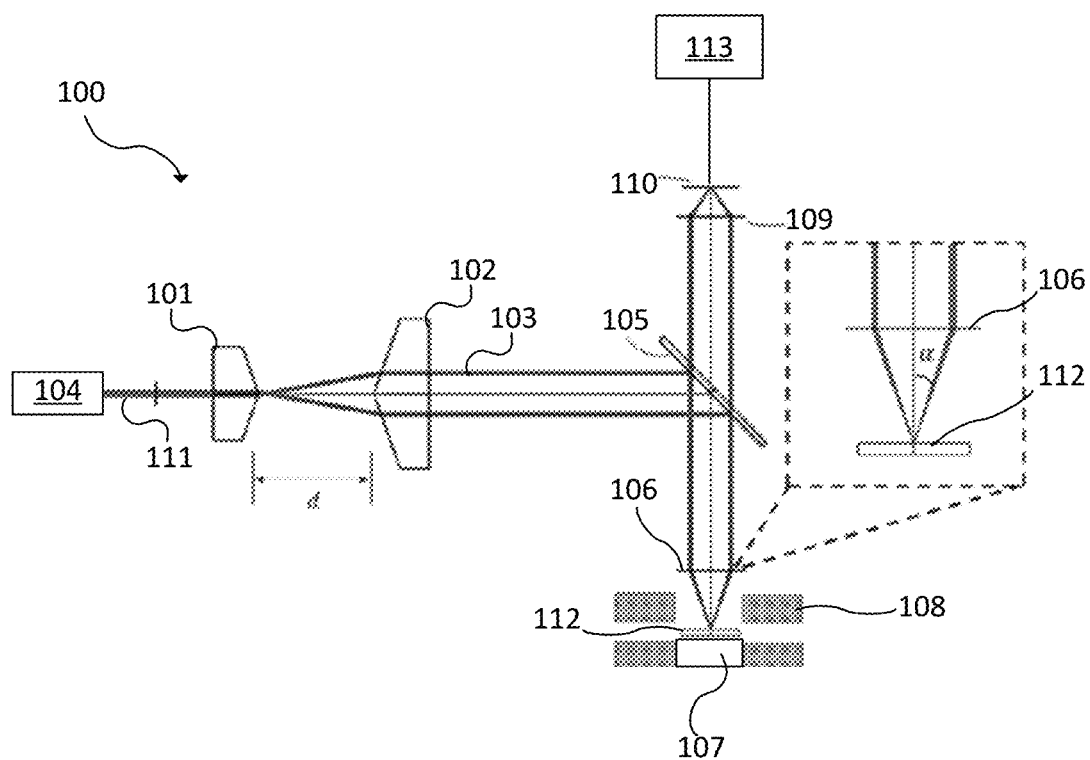
FIG. 1 is a diagram of an embodiment of a system in accordance with the present disclosure.

FIG. 1 is a diagram of an embodiment of a system 100 that uses a transmissive axicon telescope. In FIG. 1, d is the distance of the apex for the two axicon lenses 101 and 102. The axicon lenses 101 and 102 receive the incident laser 103. α is the incident angle, which can vary in the objective with different NA.

In an instance, the axicon lens 101 has a diameter of approximately 25 mm, a clear aperture of greater than 90%, an edge thickness of approximately 5 mm, and an angle of 5 degrees. The axicon lens 102 is similar to the axicon lens 101 except that it has a diameter of approximately 50 mm. The axicon lenses 101 and 102 can be fabricated of UV fused silica with a broadband antireflection coating. Other dimensions and angles are possible.

Figure 17:
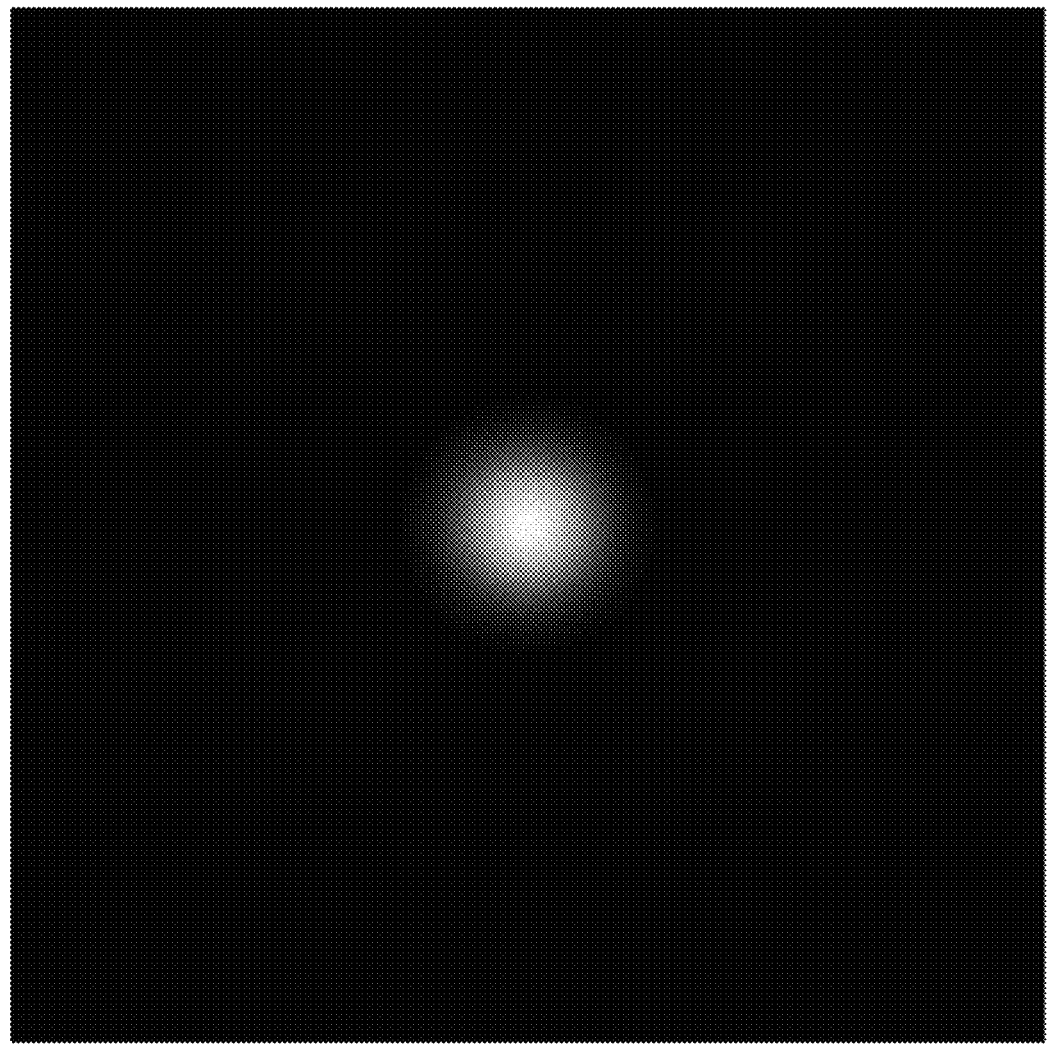
FIG. 17 shows simulation results of a Gaussian beam profile distribution before axicon lenses.
Figure 18:
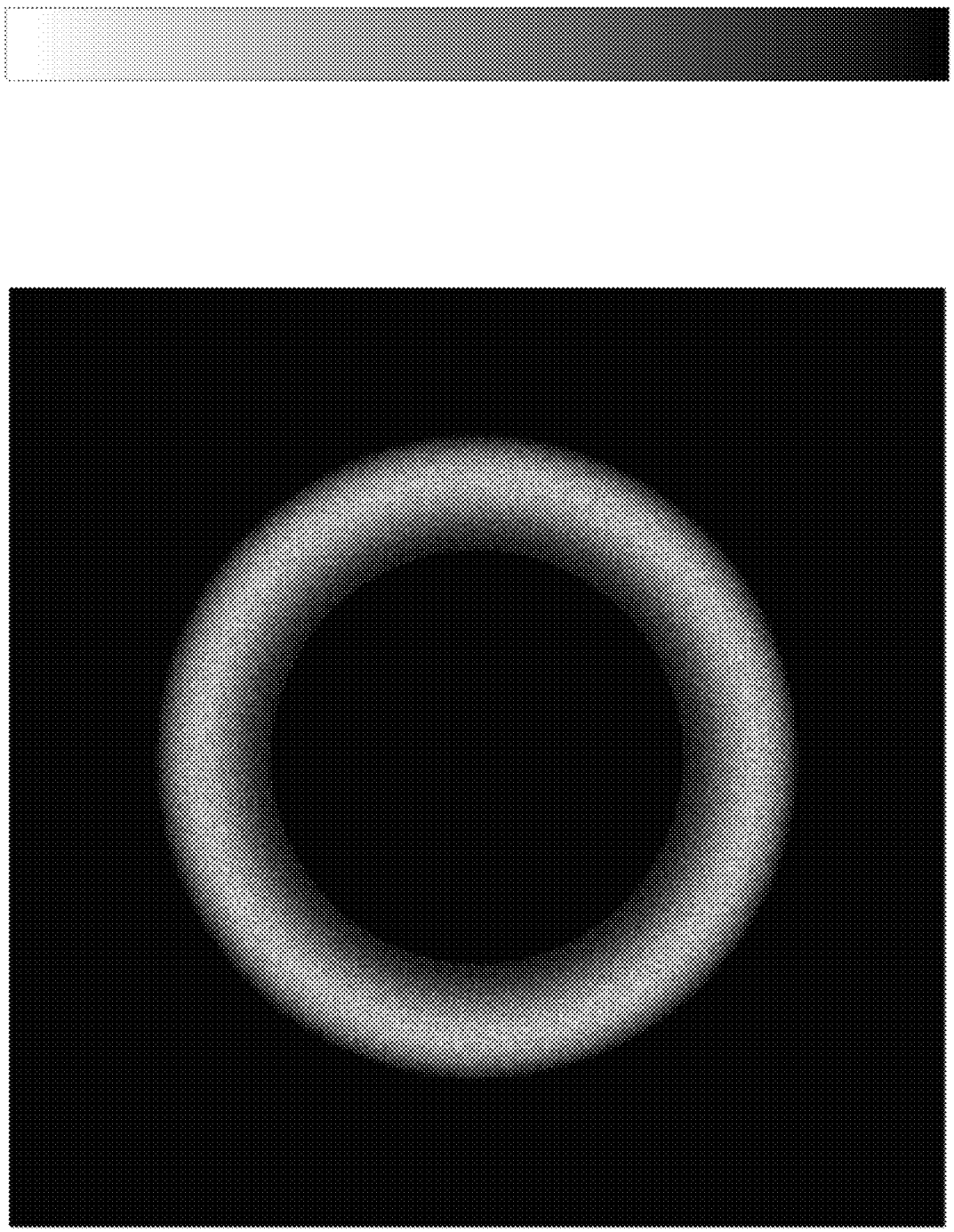
FIG. 18 shows simulation results of a hollowed laser ring profile distribution after axicon lenses.

The system 100 includes a laser source 104 that generates a laser beam 111 with a Gaussian beam profile. The laser beam 111 passes through the first axicon lens 101 and the second axicon lens 102. The first axicon lens 101 and the second axicon lens 102 are configured to transform the Gaussian beam profile of the laser beam 111 to laser beam with a hollowed laser ring 103. Simulation results of a Gaussian beam profile and hollowed laser ring are shown in FIGS. 17 and 18.

An optical component 105 is configured to receive the laser beam with the hollowed laser ring 103. The optical component 105 can be, for example, a beam splitter or a fold mirror. A stage 107 is configured to hold a wafer 112. One or more electromagnets 108 are disposed proximate the stage 107 to provide a variable magnetic field. An objective 106 is disposed between the optical component 105 and the stage 107. A detector 110 is configured to receive the laser beam 103 reflected from the wafer 112. A focal lens 109 is disposed between the detector 110 and the optical component 105. When collecting the MOKE signal, a magnetic field is applied around the wafer 112 using the electromagnets 108. The detector 110 observes the laser signal changes when the magnetic field changes.

The objective 106 can be a Schwarzschild reflective objective, which may be fully reflective. One of the conical mirrors defines a central hole that the laser beam passes through.

Figure 2:
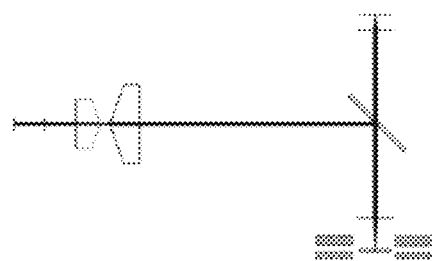
FIGS. 2-5 are diagrams showing movement of the axicon lenses of FIG. 1.
Figure 3:
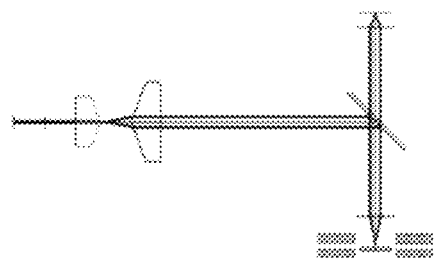
Figure 4:
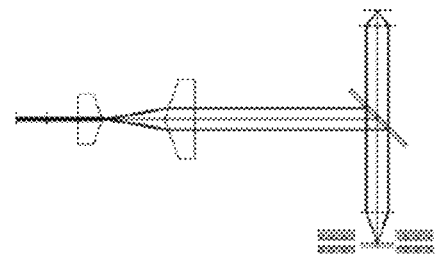
Figure 5:
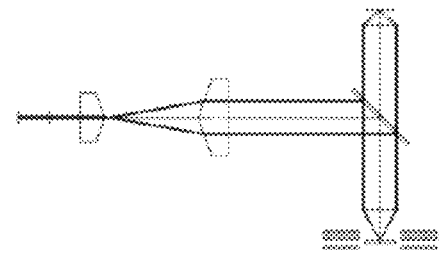
Figure 19:
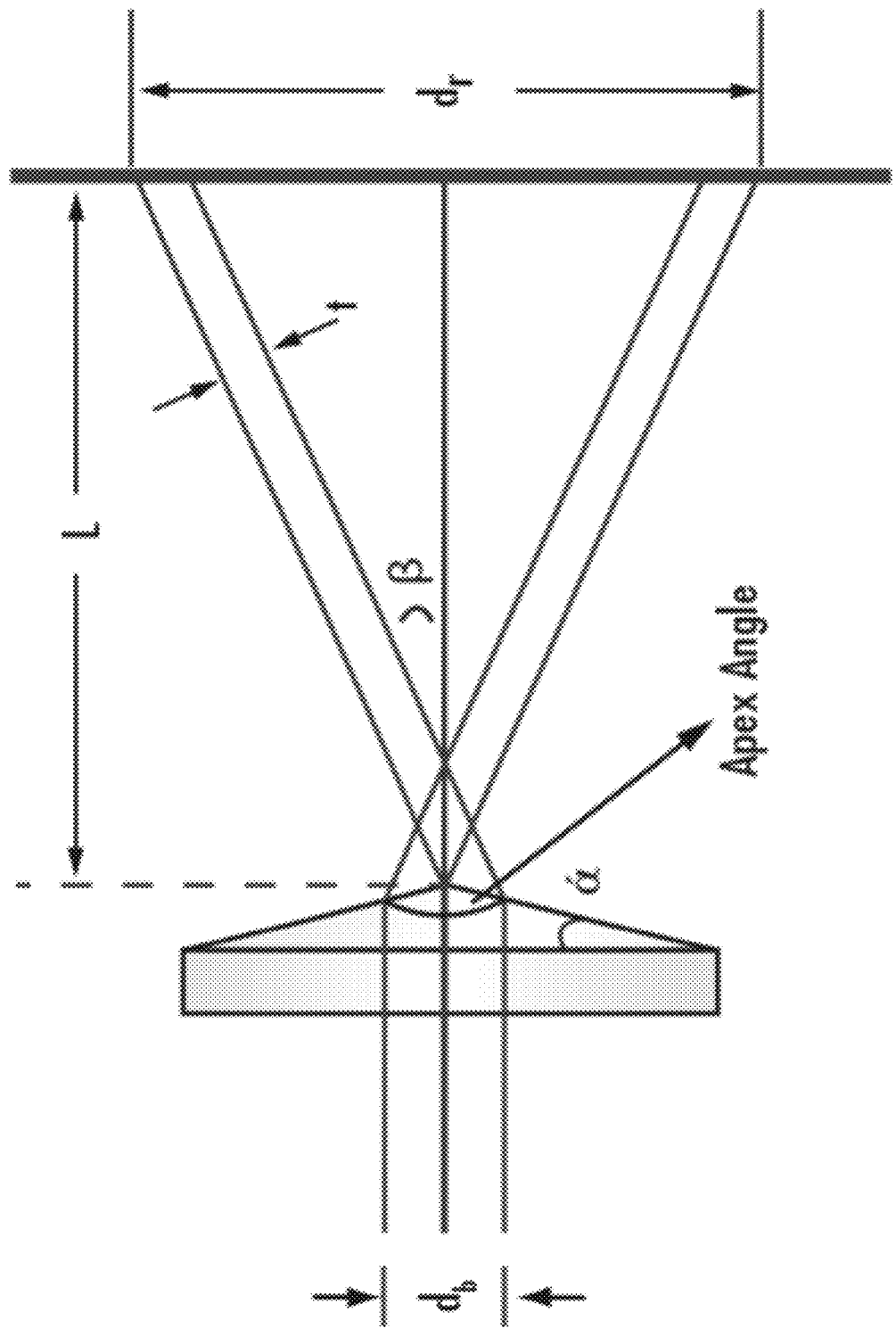
FIG. 19 is a diagram showing a relationship between variables for the axicon lenses of FIG. 1.

As shown in FIG. 1, the first axicon lens 101 and the second axicon lens 102 transform the Gaussian beam profile into a hollowed laser ring. The ring thickness and collimation can depend on the parameters of incident laser beam. The ring thickness may be the half diameter of the incident laser beam, while the collimation of the output laser ring can have a non-linear relationship with the collimation of incident laser beam. By moving the second axicon lens as shown in FIGS. 2-5, the gap between the apex of two axicons can be changed and can lead to a hollowed laser ring of variable diameter with desired collimation. FIG. 2 is a normal incident angle. FIG. 3 is a 10 degree incident angle. FIG. 4 is a 20 degree incident angle. FIG. 5 is a 30 degree incident angle. FIG. 19 shows an example where $d_r$ is an outer diameter of the ring that the laser beam forms, $d_b$ is a diameter of the beam that enters the lens, t is the thickness of the line that the beam forms, β is a half fan angle that the beam forms, L is the length from the axicon to the image that is formed, n is the refractive index of the axicon, and α is the axicon angle. The effect of the axicon is described by the following equations.

$$d_r = 2L \tan[(n-1)\alpha]$$

$$\beta = \sin^{-1}(n \sin \alpha) - \alpha$$

$$t = \tfrac{1}{2} d_b$$

A relationship between the gap between the apex of the two axicons, laser beam diameter, and incident angle is shown in the table below.

| Gap Between the Apex of Two Axicons | Beam Diameter | Incident Angle |
| --- | --- | --- |
| 35 mm | 2797 μm | 16.62° |
| 39 mm | 3100 μm | 17.71° |
| 42 mm | 3373 μm | 19.12° |
| 46 mm | 3667 μm | 20.12° |
| 50 mm | 4028 μm | 22.98° |
| 53 mm | 4235 μm | 24.35° |
| 56 mm | 4445 μm | 26.43° |
| 59 mm | 4752 μm | 27.46° |

Turning back to FIG. 1, the laser beam with a hollowed laser ring 103 then is reflected by optical component 105 to the entrance pupil of the objective 106. For an objective with different NA, the incident angle will be changed correspondingly while the hollowed laser ring 103 is changing, and the spot size on the image plane can be reduced to less than 1 μm.

In different cases, the objective 106 can be changed to meet different incident angle requirements and various spatial resolutions. The reflected laser beam 103, which carries the sample information, is directed into the detector 110 by the focal lens 109. The surface MOKE signal from a certain angle can be obtained, such as using the processor 113 in electronic communication with the detector 110. When the relative distance between two apex positions of the axicon lenses 101, 102 is changed, the incident angle on the wafer will be correspondingly changed while the reflected MOKE signal from different angle can be detected.

Compared with other methods of laser scanning, operation of system 100 can overcome the light intensity loss. Over 98% optical power can be transmitted if the axicon lens 101, 102 include an antireflective coating. When the diameter of laser beam with a hollowed laser ring 103 changes, the output collimation is constant, which is beneficial for a variable incident angle system with an infinity corrected objective. High spatial resolution can be achieved. The system 100 also can achieve laser scanning and high spatial resolution simultaneously without additional components or space. Calibration also may be simplified because of the fewer components that are adjusted.

Figure 6:
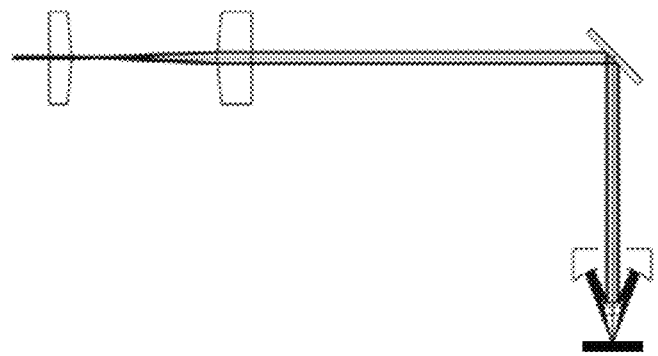
FIGS. 6-8 are diagrams showing combination of the axicon lenses of FIG. 1 with a Schwarzschild objective.
Figure 7:
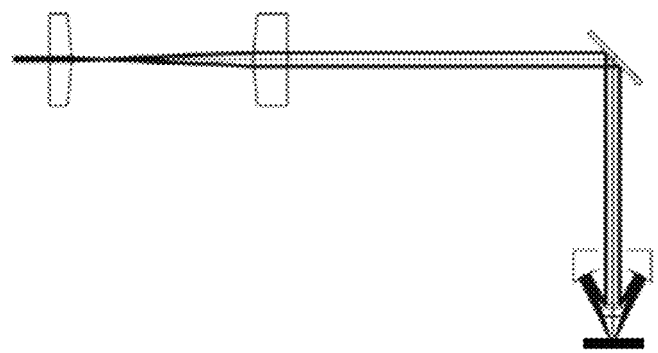
Figure 8:
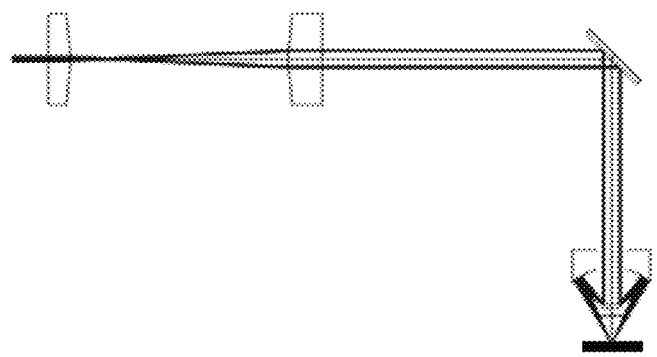

FIGS. 6-8 are diagrams showing combination of the axicon lenses of FIG. 1 with a Schwarzschild objective. In an instance, the Schwarzchild objective has a magnification of 40×, a focal length 5.0 mm, an entrance pupil diameter 5.1 mm, and a field of view 0.5 mm.

FIGS. 6-8 represent different gaps between the two axicon lenses and the corresponding beam path in the objective. FIG. 6 results in a distance of 42 mm and an incident angle of 19.12 degrees. FIG. 7 results in a distance of 50 mm and an angle of 22.98 degrees. FIG. 8, results in a distance of 59 mm and an incident angle of 27.46 degrees.

Compared with Gaussian beam incidence, all the laser power of the laser beam with a hollowed laser ring 103 can pass through the Schwarzschild objective. As described above, the axicon telescope can provide different incident angles of objective that can be achieved continuously by changing the laser ring diameter in the pupil plane of objective. As shown in FIGS. 6-8, the system includes two axicon lens, a fold mirror as the optical component, and a Schwarzschild reflective objective. The Schwarzschild reflective objective may be partially or fully reflective.

The axicon lenses have the same angles so when the second axicon lens is moved, a collimated laser ring will be observed and then illuminated into the pupil plane of the reflective objective. By adjusting the gap between two axicon lenses, a group of laser rings with various diameters that match the reflective objective can be made. For instance, if the laser ring diameter is smaller than certain value, the laser power will not be reflected by the second mirror while similarly it cannot be reflected by the first mirror if the laser ring diameter is larger than another certain value. The laser may only be reflected in the zone cycles. Therefore, in the case of ring laser matching with that zone cycles, pupil obscuration can be avoided.

Figure 11:
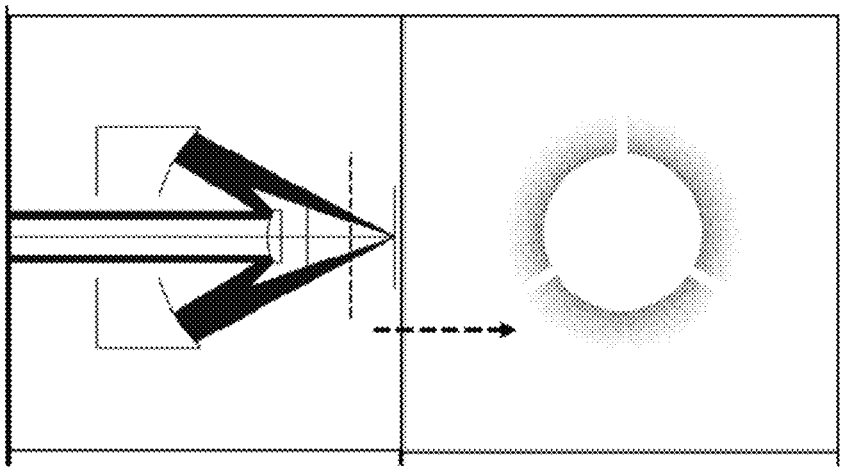
FIGS. 9-11 are diagrams showing incident angles from 16 degrees to 30 degrees (top) and resulting cross-section of the laser beam (bottom)
Figure 10:
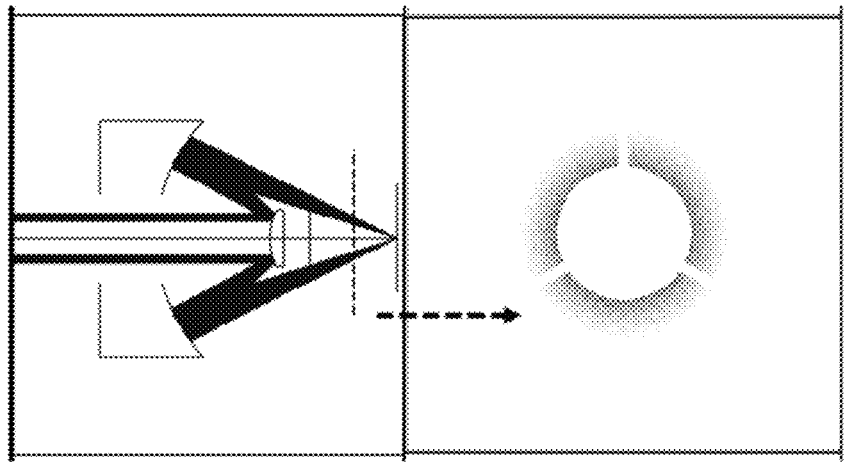
Figure 9:
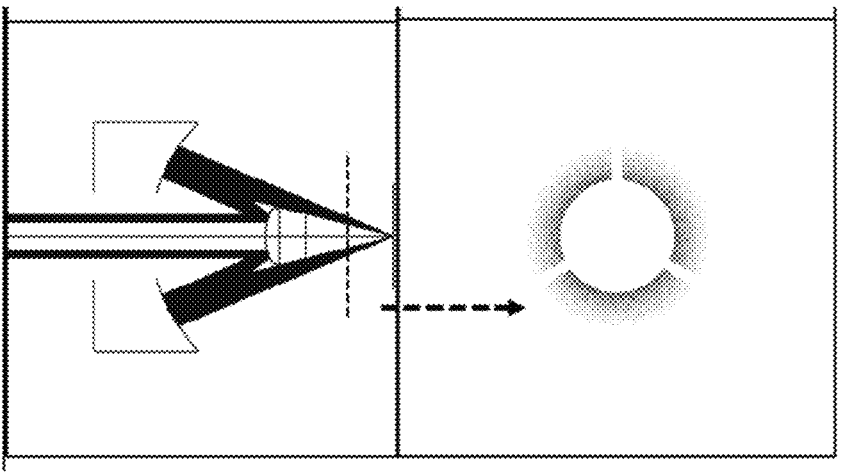

FIGS. 9-11 are diagrams showing incident angles on the wafer from 16 degrees to 30 degrees (top) and resulting cross-section of the laser beam (bottom). The cross-section of the laser beam is an out of focus position. The support (spider) patterns in the cross-section of the laser beam are caused by mechanical mounting of the objective housing. The top diagrams in FIGS. 9-11 correspond to the details of FIGS. 6-8, which correspond to the incident angle of 19.12 degrees, 22.98 degrees and 27.46 degrees. The bottom of FIGS. 9-11 give the beam profile on the image plane. The blocked bar area was caused by the obscuration of the mechanical mounting inside the objective, which has little effect on the measurement results.

In a MOKE metrology system, applying the Schwarzschild reflective objective embodiments of FIGS. 6-11 to the inspection station can provide sample information from different incident angles. The best signal response angle or designated angle in different application field can be determined. The range of incident angles may depend on the NA and obscuration proportion of the objective. Real-time imaging can be obtained with a corresponding tube lens and camera. Not only can real-time imaging be used for laser spot calibration, but it also can be implemented as a pattern recognition system. In addition, up to few Tesla magnetic field in a MOKE system can induce a Faraday rotation effect when the objective is refractive objective, which can make it difficult to distinguish the MOKE signal with the Faraday rotation signal. No Faraday rotation will occur in the systems disclosed herein because no optical glass is used and an all-reflected system is provided.

In metrology equipment used to optically measure critical dimensions and materials properties, the incident angle of the light to the sample can be an important parameter. The reflectance and scatter properties of a sample can change as a function of incident angle. As a result, illuminating a sample with different angles of incidence can provide more information about a sample than just using one angle of incidence. This is the operating principal behind a multiple angle spectroscopic ellipsometer.

Embodiments disclosed herein can be used to vary the angle of incidence onto a wafer for either an ellipsometer or a reflectometer. The embodiments disclosed herein can be used at one wavelength or a narrow band of wavelengths, such as up to 20-30 nm wide. In this mode, reflectance can be measured versus angle of incidence (AOI). The bandwidth of the illumination may be limited by chromatic aberrations. For example, the angle of refraction can change as a function of wavelength. Thus, different wavelengths can have different AOIs on the sample. It is possible to calibrate this effect, which can allow the use of a wider spectrum of light. A reflective system that has the same properties as the refractive axicons can eliminate this issue.

The advantages of the embodiments disclosed herein include improving the transmittance of a Schwarzschild objective and avoiding the pupil obscuration caused by the reflector inside the Schwarzschild objective. In comparison to the traditional Gaussian beam incident, using a hollowed laser ring can improve the efficiency by at least 60%. Up to 95% of laser power is reflected by the second mirror in the Schwarzschild objective when using the hollowed laser ring. Adjusting the gap between the two axicon lens can manipulate the incident angle of objective. Sample Kerr signal from various angle can be measured. Using an all-reflective objective can eliminate the Faraday rotation in the magnetic field in the case of polarization sensitive metrology. The system can provide a synchronous detection of Kerr signal and in-situ microscopic imaging of wafer patterns. Using the axicon telescope, a different incident angle of objective can be achieved continuously by changing the laser ring diameter in the pupil plane of objective.

Figure 12:
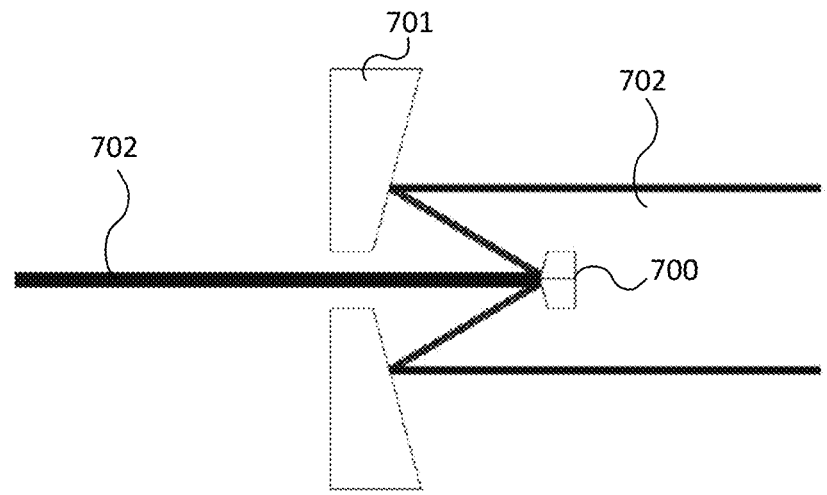
FIGS. 12 and 13 are diagrams showing a reflective design.
Figure 13:
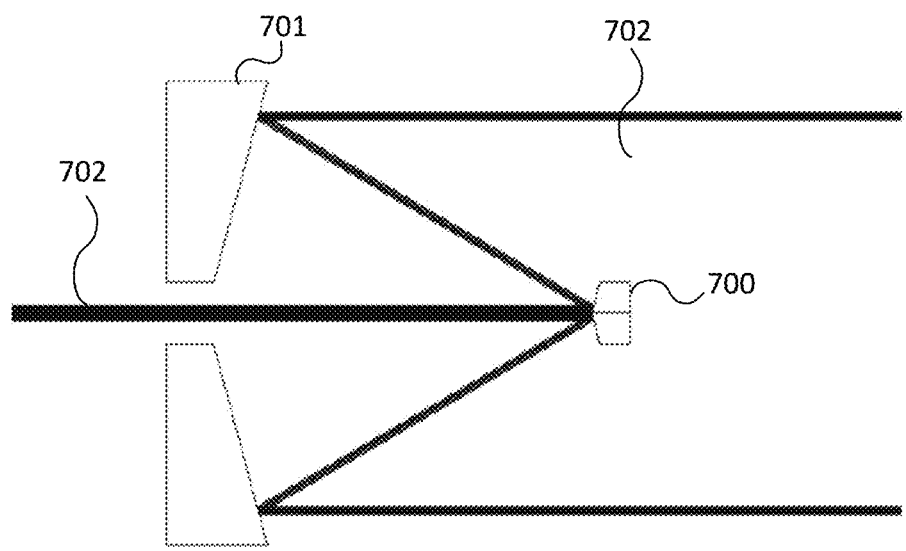

A reflective axicon telescope is shown in FIGS. 12 and 13. The reflective axicon telescope of FIGS. 12 and 13 can achieve the same effect as the transmissive axicon telescope shown in FIGS. 9-11. Thus, the first mirror 700 and second mirror 701 in FIGS. 12 and 13 can replace the two axicon lenses 101 and 102 in FIG. 1. The objective 106 in FIG. 1 is optional when using the first mirror 700 and second mirror 701 instead of the two axicon lenses 101 and 102. Various types of objectives 106 besides a Schwarzschild reflective objective are possible when using the first mirror 700 and second mirror 701.

The reflective axicon telescope of FIGS. 12 and 13 can be moved in the same way as the transmissive axicon of FIG. 1 to achieve a similar effect as the axicon lenses of FIG. 1. Thus, the reflective axicon telescope of FIGS. 12 and 13 can generate a laser beam with a hollowed laser ring. When the distance between the first mirror 700 and second mirror 701 changes, it can change the incident angles in the same manner as the refractive axicons. However, since it is reflective (e.g., up to 98% reflective), it may be completely wavelength insensitive. This can allow the same technique to be used with broad spectrum illumination, such as with a spectrum wider than 100 nm. The reflective optics can be cone shaped. The second cone of the second mirror 701 has a hole in the center to allow for the light 702 to pass through it. The specific angles and shapes can be optimized to match the requirements of the system being designed.

In an embodiment, an input laser beam is collimated and has a diameter 2 mm. The first mirror 700 can be an axicon or cone mirror with an angle from 10 degrees to 20 degrees and a diameter from 5 mm to 10 mm. The diameter or angle of the first mirror 700 can be adjusted for a particular application. The second mirror 701 can be an axicon or cone mirror with a diameter from 50 mm to 70 mm. The second mirror 701 may have a diameter from five to fourteen times as large as the diameter of the first mirror 700, including all values to the 0.5 and ranges in between. In an example, the second mirror 701 has a diameter from seven to eight times as large as the diameter of the first mirror 700. The angle of the second mirror 701 can be configured to match the angle of the first mirror 700. The diameter of the second mirror 701 can be configured to accommodate the largest size ring that is generated. Other dimensions and angles are possible.

The relationship between beam size and mirror separation is approximately linear. A 15.05 degree angle on the first mirror 700 and second mirror 701 with a separation of 10 mm can generate a ring with a diameter of approximately 10.4 mm. A 15.05 degree angle on the first mirror 700 and second mirror 701 with a separation of 25 mm can generate a ring with a diameter of approximately 26 mm. A 15.05 degree angle on the first mirror 700 and second mirror 701 with a separation of 50 mm can generate a ring with a diameter of approximately 52 mm.

The reflective surface can be formed using various techniques. One technique is diamond turning. Diamond turning can be used to make any arbitrary shape that has an axis of rotation. One advantage of diamond turning is that it can make an optic with accurate mounting features. These accurate mounting surfaces can be useful for either eliminating the need for optical alignment or making the alignment easier than it would be without the mounting features.

The first mirror 700 and second mirror 701 can be fabricated of Pyrex, N-BK7, fused silica, or other materials.

The coating on the first mirror 700 and second mirror 701 may depend on the desired wavelength range. For example, UV-enhanced aluminum has reflectivity from 80% to 90% from 250 nm to 700 nm. In another example, enhanced aluminum has average reflectivity greater than 95% from 450 nm to 650 nm. Higher reflectivity mirror coatings are available for a variety of wavelengths.

Figure 14:
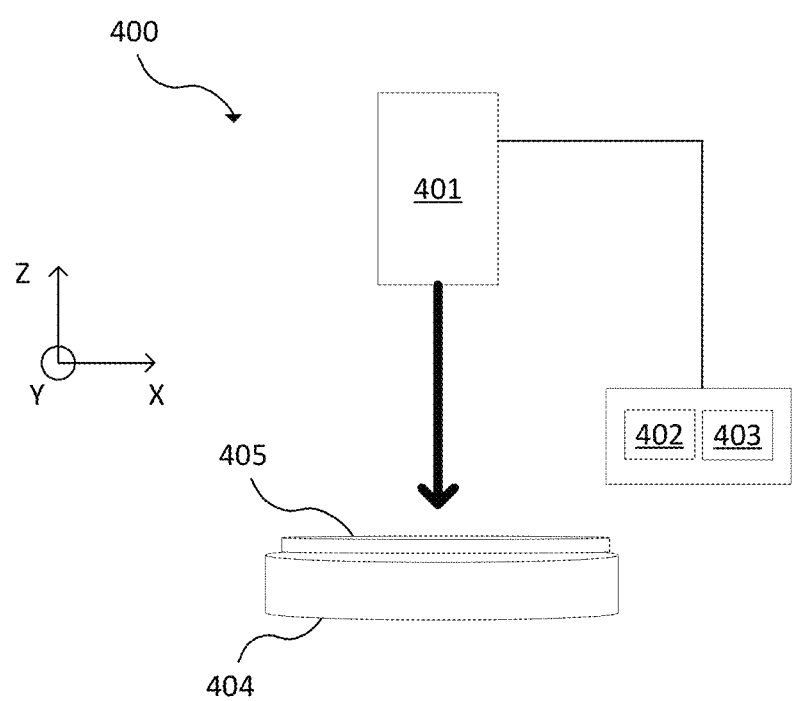
FIG. 14 is a diagram of a system in accordance with an embodiment of this disclosure.

FIG. 14 is a diagram of a system 400. The measurement system 401 may produce a beam of light or may use other techniques to measure a surface of the wafer 405. In one example, the measurement system 401 includes a laser, lamp, globar, or laser-drive light source (LDLS). In another example, the wafer metrology tool 400 is a broad-band plasma inspection tool and the measurement system 401 includes a broad-band plasma source. The measurement system 401 can provide information about the wafer 405 or can provide information used to form images of the wafer 405. The wafer 405 may be on a stage 404.

In particular, the wafer metrology tool 400 or measurement system 401 can be configured to provide one or more of rotating polarizer, rotating compensator spectroscopic ellipsometry data; full Mueller matrix components data; rotating polarizer spectroscopic ellipsometry data; reflectometry data; laser driven spectroscopic reflectometry data; or X-ray data.

The wafer metrology tool 400 can include any of the embodiments disclosed herein, such as the two axicon lenses 101 and 102 with the Schwarzschild reflective objective or such as the first mirror 700 and second mirror 701. The wafer 405 can be the wafer 112 and the processor 402 can be the processor 113. Other components of the system 100 can be in the measurement system 401 of the wafer metrology tool 400.

In an instance, the wafer metrology tool 400 provides spectroscopic ellipsometry using a broadband light source, a measurement system 401 that measures how the light source interacts with the target, and processing algorithms that extract the relevant parameters of the target. In another instance, the source may be a laser driven light source, which can provide high intensities and increase the signal-to-noise ratio at the detector, as opposed to a Xe lamp. In an example, the collection system includes a series of polarizers (rotating or fixed), compensators (rotating or fixed), detectors, spectrometers, cameras, lenses, mirrors, and/or collimators. To enhance target signatures, the system may use $N_2$ or Ar gas purge to extend the wavelength range to 170 nm or below.

The wafer metrology tool 400 communicates with a processor 402 and an electronic data storage unit 403 in electronic communication with the processor 402. For example, the processor 402 can communicate with the measurement system 401 or other components of the wafer metrology tool 400. The processor 402 may be implemented in practice by any combination of hardware, software, and firmware. Also, its functions as described herein may be performed by one unit, or divided up among different components, each of which may be implemented in turn by any combination of hardware, software, and firmware. Program code or instructions for the processor 402 to implement various methods and functions may be stored in controller readable storage media, such as a memory in the electronic data storage unit 403, within the processor 402, external to the processor 402, or combinations thereof.

While only one processor 402 and electronic data storage unit 403 are illustrated, more than one processor 402 and/or more than one electronic data storage unit 403 can be included. Each processor 402 may be in electronic communication with one or more of the electronic data storage units 403. In an embodiment, the one or more processors 402 are communicatively coupled. In this regard, the one or more processors 402 may receive readings received at the measurement system 401 and store the reading in the electronic data storage unit 403 of the processor 402. The processor 402 and/or electronic data storage unit 403 may be part of the wafer metrology tool 400 itself or may be separate from the wafer metrology tool 400 (e.g., a standalone control unit or in a centralized quality control unit).

For example, the processor 402 can be in electronic communication with a spectroscoping reflectometer and an FTIR spectrometer in the measurement system 401.

The processor 402 may be coupled to the components of the wafer metrology tool 400 in any suitable manner (e.g., via one or more transmission media, which may include wired and/or wireless transmission media) such that the processor 402 can receive the output generated by the wafer metrology tool 400, such as output from the measurement system 401. The processor 402 may be configured to perform a number of functions using the output. For instance, the processor 402 may be configured to measure layers on the wafer 405. In another example, the processor 402 may be configured to send the output to an electronic data storage unit 403 or another storage medium without reviewing the output. The processor 402 may be further configured as described herein.

The processor 402, other system(s), or other subsystem(s) described herein may take various forms, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool. For example, the processor 402 may include a microprocessor, a microcontroller, or other devices.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 402 also may be part of a defect review system, an inspection system, a metrology system, or some other type of system. Thus, the embodiments disclosed herein describe some configurations that can be tailored in a number of manners for systems having different capabilities that are more or less suitable for different applications.

The processor 402 may be in electronic communication with the measurement system 401 or other components of the wafer metrology tool 400. The processor 402 may be configured according to any of the embodiments described herein. The processor 402 also may be configured to perform other functions or additional steps using the output of the measurement system 401 or using images, measurements, or data from other sources.

In another embodiment, the processor 402 may be communicatively coupled to any of the various components or sub-systems of wafer metrology tool 400 in any manner known in the art. Moreover, the processor 402 may be configured to receive and/or acquire data or information from other systems (e.g., inspection results from an inspection system such as a review tool, another metrology tool, a remote database including design data and the like) by a transmission medium that may include wired and/or wireless portions. In this manner, the transmission medium may serve as a data link between the processor 402 and other subsystems of the wafer metrology tool 400 or systems external to wafer metrology tool 400.

In some embodiments, various steps, functions, and/or operations of wafer metrology tool 400 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link. For instance, the various steps described throughout the present disclosure may be carried out by a single processor 402 (or computer system) or, alternatively, multiple processors 402 (or multiple computer systems). Moreover, different sub-systems of the wafer metrology tool 400 may include one or more computing or logic systems. Therefore, the above description should not be interpreted as a limitation on the present disclosure, but merely an illustration.

In an instance, the wafer metrology tool 400 in FIG. 14 may include an illumination system which illuminates a target; a measurement system 401 which captures relevant information provided by the illumination system's interaction (or lack thereof) with a target, device, or feature on the wafer 405; and a processor 402 which analyzes the information collected using one or more algorithms.

While illustrated as on the same axis in FIG. 14, the beam of light from a light source of the measurement system 401 may be directed at the wafer 405 at an angle and can be reflected from the wafer 405 to a detector of the measurement system 401 at a different angle.

The wafer metrology tool 400 can include one or more hardware configurations which may be used to measure the various semiconductor structural and material characteristics. Examples of such hardware configurations include, but are not limited to, a spectroscopic ellipsometer (SE); an SE with multiple angles of illumination; an SE measuring Mueller matrix elements (e.g., using rotating compensator(s)); a single-wavelength ellipsometers; a beam profile ellipsometer (angle-resolved ellipsometer); a beam profile reflectometer (angle-resolved reflectometer); a broadband reflective spectrometer (spectroscopic reflectometer); a single-wavelength reflectometer; an angle-resolved reflectometer; an imaging system; or a scatterometer (e.g., speckle analyzer). The hardware configurations can be separated into discrete operational systems or can be combined into a single tool.

The illumination system of certain hardware configurations can include one or more light sources. The light source may generate light having only one wavelength (i.e., monochromatic light), light having a number of discrete wavelengths (i.e., polychromatic light), light having multiple wavelengths (i.e., broadband light), and/or light the sweeps through wavelengths, either continuously or hopping between wavelengths (i.e., tunable sources or swept source). Examples of suitable light sources are: a white light source, an ultraviolet (UV) laser, an arc lamp or an electrode-less lamp, a laser sustained plasma (LSP) source, a supercontinuum source such as a broadband laser source, shorter-wavelength sources such as X-ray sources, extreme UV sources, or some combination thereof. The light source may also be configured to provide light having sufficient brightness, which in some cases may be a brightness greater than about 1 W/(nm cm$^2$ Sr). The wafer metrology tool 400 may also include a fast feedback to the light source for stabilizing its power and wavelength. Output of the light source can be delivered via free-space propagation, or in some cases delivered via optical fiber or light guide of any type.

The wafer metrology tool 400 may be designed to make many different types of measurements related to semiconductor manufacturing. For example, in certain embodiments the wafer metrology tool 400 may measure characteristics of one or more targets, such as critical dimension, overlay, sidewall angles, film thicknesses, or process-related parameters (e.g., focus and/or dose). The targets can include certain regions of interest that are periodic in nature, such as gratings in a memory die. Targets can include multiple layers (or films) whose thicknesses can be measured by the wafer metrology tool 400. Targets can include target designs placed (or already existing) on the semiconductor wafer for use, such as with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools. The data from such measurements may be combined. Data from the metrology tool can be used in the semiconductor manufacturing process, for example, to feed-forward, feed-backward, and/or feed-sideways corrections to the process (e.g., lithography, etch) and, therefore, can yield a complete process control solution.

To improve measurement accuracy and matching to actual device characteristics and to improve in-die or on-device measurements, various metrology implementations can be used. For example, focused beam ellipsometry based on primarily reflective optics can be used. Apodizers can be used to mitigate the effects of optical diffraction causing the spread of the illumination spot beyond the size defined by geometric optics. The use of high-NA tools with simultaneous multiple area of interest illumination is another way to achieve small-target capability. Other measurement examples may include measuring the composition of one or more layers of the semiconductor stack, measuring certain defects on (or within) the wafer, and measuring the amount of photolithographic radiation exposed to the wafer. In some cases, a metrology tool and algorithm may be configured for measuring non-periodic targets.

In addition, there are typically numerous optical elements in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. Multiple metrology heads can be integrated on the same tool. However, in many cases, multiple metrology tools are used for measurements on a single or multiple metrology targets.

Measurement of parameters of interest usually involves a number of algorithms. For example, optical interaction of the incident beam with the sample can be modeled using an electro-magnetic (EM) solver and can use algorithms such as rigorous coupled-wave analysis (RCWA), finite element method (FEM), method of moments, surface integral method, volume integral method, finite-difference time-domain (FDTD), and others. The target of interest is usually modeled (parameterized) using a geometric engine, or in some cases, process modeling engine or a combination of both. A geometric engine can be implemented, such as the AcuShape software product of KLA Corporation.

Collected data can be analyzed by a number of data fitting and optimization techniques and technologies including: libraries; fast-reduced-order models; regression; machine-learning algorithms such as neural networks and support-vector machines (SVM); dimensionality-reduction algorithms such as principal component analysis (PCA), independent component analysis (ICA), and local-linear embedding (LLE); sparse representation such as Fourier or wavelet transform; Kalman filter; algorithms to promote matching from same or different tool types; and others. Collected data can also be analyzed by algorithms that do not include modeling, optimization and/or fitting.

Computational algorithms are usually optimized for metrology applications with one or more approaches being used such as design and implementation of computational hardware, parallelization, distribution of computation, load-balancing, multi-service support, or dynamic load optimization. Different implementations of algorithms can be done in firmware, software, field programmable gate array (FPGA), and programmable optics components, etc.

The data analysis and fitting steps usually pursue one or more goals. For example, the goal may be measurement of critical dimension, sidewall angle (SWA), shape, stress, composition, films, bandgap, electrical properties, focus/dose, overlay, generating process parameters (e.g., resist state, partial pressure, temperature, and focusing model), and/or any combination thereof. The goal may be modeling and/or design of metrology systems. The goal also may be modeling, design, and/or optimization of metrology targets.

Embodiments of the present disclosure address the field of semiconductor metrology and are not limited to the hardware, algorithm/software implementations and architectures, and use cases summarized above.

Figure 15:
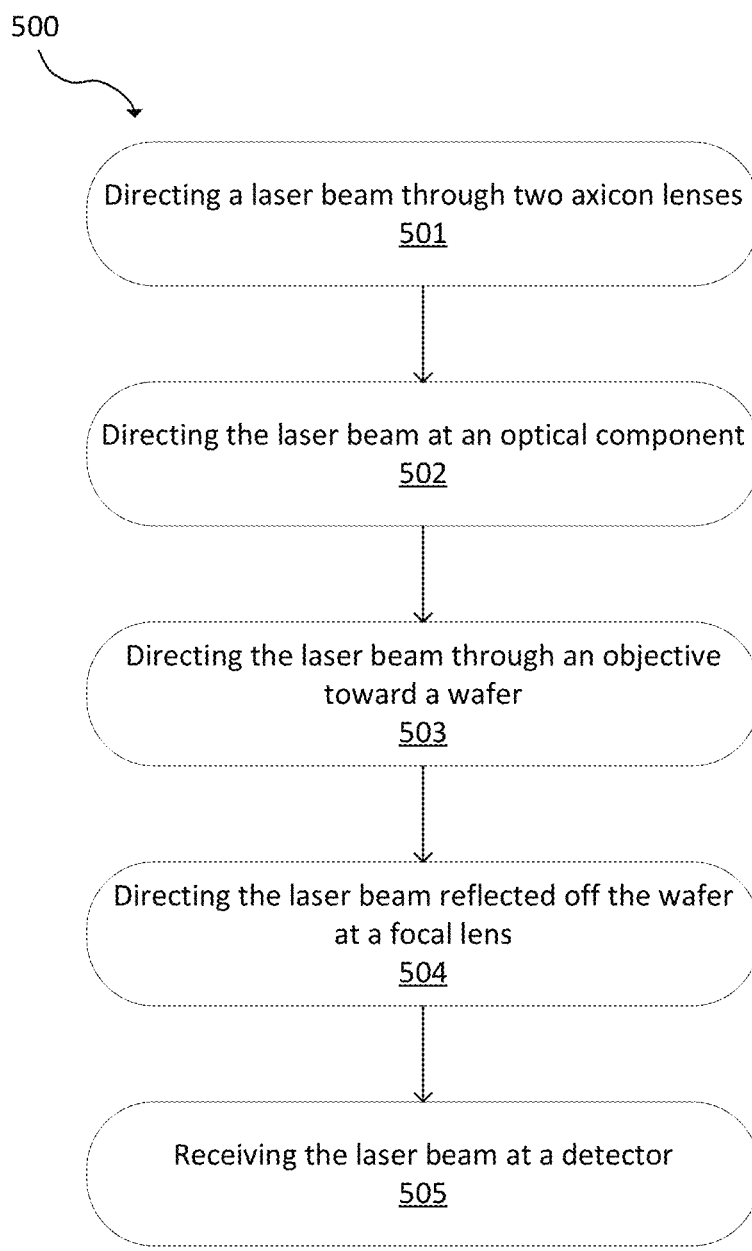
FIG. 15 is a flowchart of a method in accordance with an embodiment of this disclosure.

FIG. 15 is a flowchart of a method 500, which corresponds to the system of FIG. 1. At 501, a laser beam with a Gaussian beam profile is directed through a first axicon lens and a second axicon lens thereby transforming the Gaussian beam profile of the laser beam to a hollowed laser ring. A gap between the first axicon lens and the second axicon lens can be adjusted whereby a diameter of the laser beam with the hollowed laser ring is adjusted while collimation is constant. An incident angle of the laser beam with the hollowed laser ring can be adjusted while the collimation is constant.

At 502, the laser beam with the hollowed laser ring is directed at an optical component. The optical component can be a beam splitter or a fold mirror. The laser beam with the hollowed laser ring is directed through an objective toward a wafer at 503. The objective can be a Schwarzschild reflective objective. The laser beam is reflected off the wafer at a focal lens at 504. The laser beam from the focal lens is received at a detector at 505.

A magneto-optic Kerr effect metrology signal at an angle can be determined using a processor in electronic communication with the detector.

Figure 16:
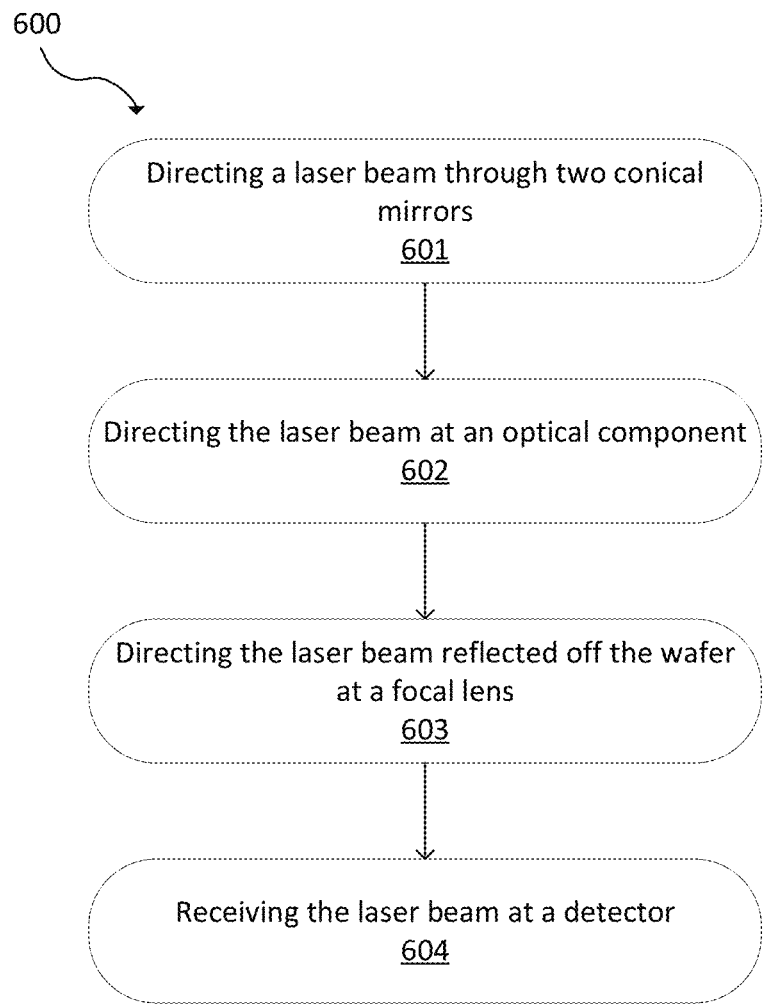
FIG. 16 is a flowchart of another method in accordance with an embodiment of this disclosure.

FIG. 16 is a flowchart of another method 600, which corresponds to the system of FIGS. 12 and 13. At 601, a laser beam with a Gaussian beam profile is directed through two conical mirrors thereby transforming the Gaussian beam profile of the laser beam to a hollowed laser ring. One of the conical mirrors defines a central hole that the laser beam passes through.

At 602, the laser beam with the hollowed laser ring is optionally directed at an optical component. The optical component can be a beam splitter or a fold mirror. The laser beam with the hollowed laser ring is optionally directed through an objective toward a wafer. The laser beam is reflected off the wafer at a focal lens at 603. The laser beam from the focal lens is received at a detector at 604.

A magneto-optic Kerr effect metrology signal at an angle can be determined using a processor in electronic communication with the detector.

In an experiment, a Schwarzschild reflective objective was used with both a 5 mW Gaussian laser beam and a 5 mW hollowed laser ring. 2.05 mW of laser power was collected at the focal position for the Gaussian laser beam. At a comparable configuration, 4.88 mW of laser power was collected at the focal position for the hollowed laser ring. Thus, the hollowed laser ring can provide more laser power with a Schwarzschild reflective objective.

In another experiment, a Schwarzschild reflective objective was used with a hollowed laser ring. This table below addresses the relationship between beam diameter and incident angle based on feasibility testing.

| Beam Diameter | Incident Angle |
| --- | --- |
| 2797 μm | 16.62° |
| 3100 μm | 17.71° |
| 3373 μm | 19.12° |
| 3667 μm | 20.12° |
| 4028 μm | 22.98° |
| 4235 μm | 24.35° |
| 4445 μm | 26.43° |
| 4752 μm | 27.46° |

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a laser source that generates a laser beam with a Gaussian beam profile;
   an transmissive axicon telescope configured to transform the Gaussian beam profile of the laser beam to a hollowed laser ring, wherein the transmissive axicon telescope includes:
   a first axicon lens;
   a second axicon lens, wherein the laser beam passes through the first axicon lens and the second axicon lens, and wherein the first axicon lens and the second axicon lens define an adjustable gap therebetween whereby a diameter of the laser beam with the hollowed laser ring is adjusted while collimation is constant; and
   an objective disposed between the optical component and the stage, wherein the objective is a Schwarzschild reflective objective;
   an optical component configured to receive the laser beam with the hollowed laser ring, wherein the optical component is a beam splitter or a fold mirror;
   a stage configured to hold a wafer;
   a detector configured to receive the laser beam reflected from the wafer; and
   a focal lens disposed between the detector and the optical component.

2. The system of claim 1, wherein the laser beam has an incident angle from 16 degrees to 30 degrees using the Schwarzschild reflective objective.

3. The system of claim 1, wherein the Schwarzschild reflective objective is fully reflective.

4. The system of claim 1, wherein the first axicon lens and the second axicon lens are configured to include a same angle.

5. The system of claim 1, further comprising an electromagnet disposed proximate the stage.

6. The system of claim 1, wherein a spot size of the laser beam directed through the objective and onto the wafer is less than 1 µm.

7. A magneto-optic Kerr effect metrology system including the system of claim 1.

8. A method comprising:
   directing a laser beam through an transmissive axicon telescope thereby transforming the Gaussian beam profile of the laser beam to a hollowed laser ring, wherein directing the laser beam through the transmissive axicon telescope includes:
   directing a laser beam with a Gaussian beam profile through a first axicon lens and a second axicon lens;
   directing the laser beam with the hollowed laser ring through an objective toward the wafer, wherein the objective is a Schwarzschild reflective objective; and
   adjusting a gap between the first axicon lens and the second axicon lens whereby a diameter of the laser beam with the hollowed laser ring is adjusted while collimation is constant;
   directing the laser beam with the hollowed laser ring at an optical component, wherein the optical component is a beam splitter or a fold mirror;
   directing the laser beam with the hollowed laser ring toward a wafer;
   directing the laser beam with the hollowed laser ring reflected off the wafer to a focal lens; and
   receiving the laser beam with the hollowed laser ring from the focal lens at a detector.

9. The method of claim 8, further comprising adjusting an incident angle of the laser beam with the hollowed laser ring while the collimation is constant.

10. The method of claim 8, further comprising determining a magneto-optic Kerr effect metrology signal at an angle using a processor in electronic communication with the detector.

* * * * *